United States Patent
Choi et al.

(10) Patent No.: US 9,589,888 B2
(45) Date of Patent: Mar. 7, 2017

(54) STORAGE DEVICES, FLASH MEMORIES, AND METHODS OF OPERATING STORAGE DEVICES

(71) Applicants: Hong-Suk Choi, Suwon-si (KR); Kyu-Hyung Kim, Suwon-si (KR); Do-Sam Kim, Seoul (KR); Hyun-Sik Yun, Hwaseong-si (KR)

(72) Inventors: Hong-Suk Choi, Suwon-si (KR); Kyu-Hyung Kim, Suwon-si (KR); Do-Sam Kim, Seoul (KR); Hyun-Sik Yun, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 301 days.

(21) Appl. No.: 14/095,240

(22) Filed: Dec. 3, 2013

(65) Prior Publication Data

US 2014/0156917 A1 Jun. 5, 2014

(30) Foreign Application Priority Data

Dec. 4, 2012 (KR) ......................... 10-2012-0139675

(51) Int. Cl.

| G06F 3/00 | (2006.01) |
|---|---|
| H01L 23/525 | (2006.01) |
| H01L 27/112 | (2006.01) |
| H01L 23/532 | (2006.01) |
| G06F 12/02 | (2006.01) |

(52) U.S. Cl.
CPC ...... *H01L 23/5256* (2013.01); *G06F 12/0246* (2013.01); *H01L 23/5329* (2013.01); *H01L 27/11206* (2013.01); *H01L 2924/0002* (2013.01)

(58) Field of Classification Search
CPC .................................................. G11C 11/5628
USPC ........................................ 710/62; 365/185.03
See application file for complete search history.

(56) References Cited

U.S. PATENT DOCUMENTS

| 7,539,063 B2 * | 5/2009 | Kang ................. G11C 11/5628 365/185.22 |
|---|---|---|
| 7,554,859 B2 | 6/2009 | Choi |
| 7,755,950 B2 | 7/2010 | Yu et al. |
| 7,873,778 B2 | 1/2011 | Choi et al. |
| 7,894,258 B2 * | 2/2011 | Jeong ................. G11C 16/3454 365/185.03 |

(Continued)

FOREIGN PATENT DOCUMENTS

| JP | 2009-205555 | 9/2009 |
|---|---|---|
| KR | 10-0799688 B1 | 2/2008 |

(Continued)

OTHER PUBLICATIONS

Partial European Search Report corresponding to European Application No. 13195620.3, Dated: Jun. 23, 2014, 6 pages.

*Primary Examiner* — Titus Wong
(74) *Attorney, Agent, or Firm* — Ward and Smith, P.A.

(57) ABSTRACT

A storage device is provided including a flash memory, and a controller programming first bit data and second bit data into the flash memory and not backing up the first bit data when programming the first bit data and the second bit data in the same transaction and backing up the first bit data when programming the first bit data and the second bit data in different transactions, wherein the first bit data is less significant bit data than the second bit data, and each of the transactions is determined using a sync signal transmitted from a host.

24 Claims, 8 Drawing Sheets

(56) References Cited

U.S. PATENT DOCUMENTS

| | | |
|---|---|---|
| 7,908,429 B2 | 3/2011 | Pyeon et al. |
| 7,990,765 B2* | 8/2011 | Park .................... G11C 11/5628 365/185.03 |
| 8,031,522 B2 | 10/2011 | Jang et al. |
| 8,046,528 B2 | 10/2011 | Chu et al. |
| 2007/0014163 A1* | 1/2007 | Kim .................... G11C 11/5628 365/189.12 |
| 2008/0074928 A1* | 3/2008 | Choi .................... G11C 11/5628 365/185.17 |
| 2008/0162789 A1 | 7/2008 | Choi et al. |
| 2009/0067241 A1 | 3/2009 | Gorobets et al. |
| 2011/0216587 A1 | 9/2011 | Lee |

FOREIGN PATENT DOCUMENTS

| | | |
|---|---|---|
| KR | 10-2008-0035353 A | 4/2008 |
| KR | 10-2008-0069822 A | 7/2008 |

* cited by examiner

STORAGE DEVICES, FLASH MEMORIES, AND METHODS OF OPERATING STORAGE DEVICES

CLAIM OF PRIORITY

This application claims priority from Korean Patent Application No. 10-2012-0139675, filed on Dec. 4, 2012 in the Korean Intellectual Property Office, the disclosure of which is incorporated herein by reference as if set forth in its entirety.

FIELD

The present inventive concept relates generally to semiconductors and, in particular, to storage devices, flash memory devices, and methods of operating the storage devices.

BACKGROUND

Storage devices are used in various forms. For example, storage devices can be used in the form of memory cards, such as a secure digital (SD) card, a multimedia card (MMC), an extreme digital (xD) card, a compact flash (CF) card, a smart media (SM) card, and a memory stick. Storage devices can also be used in the form of solid state drives (SSDs).

A conventional flash memory storage device backs up a least significant bit (LSB) page paired with a most significant bit (MSB) page before programming the MSB page into a flash memory. After backing up the LSB page, the conventional flash memory storage device programs the MSB page into the flash memory.

SUMMARY

Embodiments of the present inventive concept are not restricted to the one set forth herein. The above and other aspects of the present inventive concept will become more apparent to one of ordinary skill in the art to which the present inventive concept pertains by referencing the detailed description of the present inventive concept given below.

In some embodiments of the present inventive concept, there is provided a storage device comprising, a flash memory, and a controller programming first bit data and second bit data into the flash memory and not backing up the first bit data when programming the first bit data and the second bit data in the same transaction and backing up the first bit data when programming the first bit data and the second bit data in different transactions, wherein the first bit data is less significant bit data than the second bit data, and each of the transactions is determined using a sync signal transmitted from a host.

In further embodiments of the present inventive concept, there is provided a storage device comprising, a flash memory, and a controller programming first bit data and second bit data into the flash memory and, when programming the second bit data in a current transaction, not backing up the first bit data in the current transaction if a sequence number of the first bit data is greater than a reference sequence number and backing up the first bit data in the current transaction if the sequence number of the first bit data is not greater than the reference sequence number, wherein the first bit data is less significant bit data than the second bit data, and the reference sequence number is a sequence number of bit data programmed last in a previous transaction.

In still further embodiments of the present inventive concept, there is provided a flash memory comprising, a first block into which first bit data and second bit data are programmed, and a second block into which the first bit data is not backed up when the first bit data and the second bit data are programmed in the same transaction and into which the first bit data is backed up when the first bit data and the second bit data are programmed in different transactions, wherein the first bit data is less significant bit data than the second bit data, and each of the transactions is determined using a sync signal transmitted from a host.

In some embodiments of the present inventive concept, there is provided a method of operating a storage device, the method comprising, programming first bit data into a flash memory, determining whether a sequence number of the first bit data is greater than a reference sequence number before programming second bit data into the flash memory, and not backing up the first bit data if the sequence number of the first bit data is greater than the reference sequence number, wherein the first bit data is less significant bit data than the second bit data, and the reference sequence number is a sequence number of bit data programmed last in a previous transaction.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
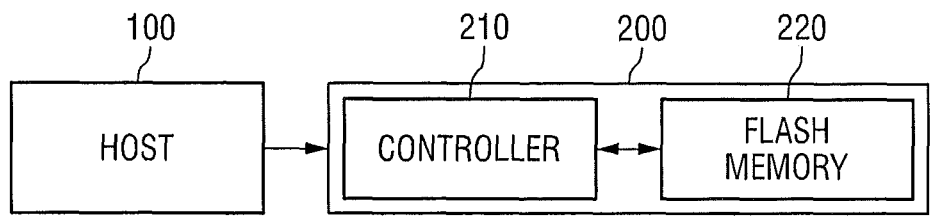
FIG. 1 is a block diagram of a system according to some embodiments of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Figure 2:
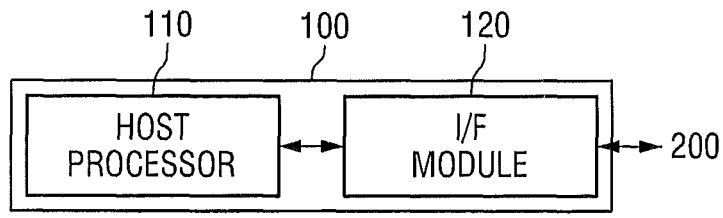
FIG. 2 is a block diagram illustrating the exemplary configuration of a host illustrated in FIG. 1.
Figure 3:
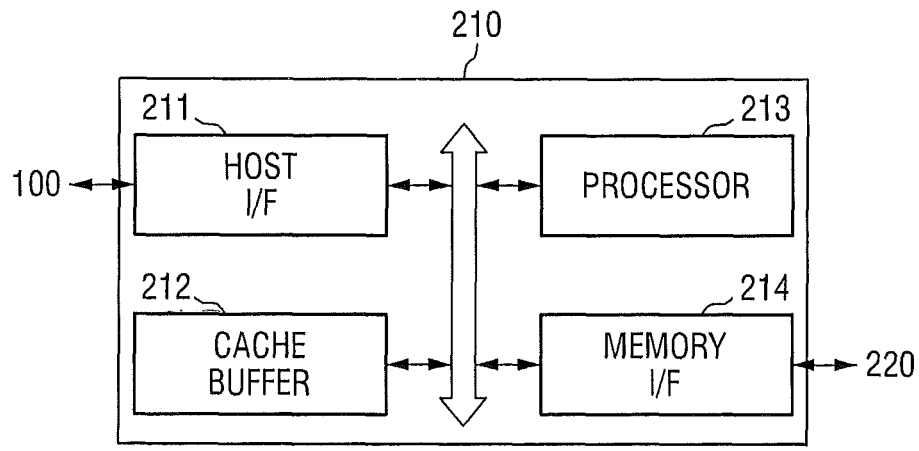
FIG. 3 is a block diagram illustrating some embodiments of the controller illustrated in FIG. 1.

Referring to FIG. 1 is a block diagram of a system 1 according to some embodiments of the present inventive concept. FIG. 2 is a block diagram illustrating the exemplary configuration of a host 100 illustrated in FIG. 1. FIG. 3 is a block diagram illustrating the exemplary configuration of a controller 210 illustrated in FIG. 1.

Referring first to FIG. 1, the system 1 according to some embodiments includes the host 100 and a storage device 200. The storage device 200 may include a flash memory 220 which stores data and the controller 210 which controls the flash memory 220.

The controller 210 is connected to the host 100 and the flash memory 220. The controller 210 is configured to access the flash memory 220 in response to a command from the host 100. For example, the controller 210 may be configured to control a read, write, erase or background operation of the flash memory 220. The controller 210 may be configured to provide an interface between the flash memory 220 and the host 100.

The controller 210 may be configured to drive firmware for controlling the flash memory 220. The flash memory 220 includes one or more memory cells. The flash memory 220 may be a multi-level cell (MLC) flash memory which stores a plurality of bit data in one memory cell. The flash memory 220 may include, for example, a NAND flash memory or a NOR flash memory.

First bit data and second bit data may be programmed into one memory cell. For example, the first bit data may be least significant bit (LSB) data, and the second bit data may be most significant bit (MSB) data. A memory cell is programmed to have any one of four states (11, 01, 10 and 11) according to a threshold voltage distribution. In the system 1 according to some embodiments, one memory cell has two bit values. However, the present inventive concept is not limited to this configuration, for example, one memory cell can have three or more bit values without departing from the scope of the present inventive concept.

A memory cell may consist of an LSB page and an MSB page which share one word line. The flash memory 220 may perform a write operation, a read operation, and the like on a page-by-page basis. The flash memory 220 programs an LSB page into a memory cell and then programs an MSB page into the memory cell into which the LSB page has been programmed.

Referring now to FIG. 2, the host 100 may include a host processor 110 and an interface module 120. Optionally, the host 100 may further include a random access memory (RAM), a read-only memory (ROM).

The host processor 110 controls the overall operation of the host 100. The host processor 110 may transmit a write command, a read command, an erase command, and the like to the storage device 200 in response to a request from an application. The host processor 110 may transmit data to be written and a sync signal to the storage device 200.

The interface module 120 is used for communication with a host interface 211 of the storage device 200. The host 100 is configured to communicate with an external device (storage device) using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Referring now to FIG. 3, the controller 210 may include a processor 213, the host interface 211, a cache buffer 212, and a memory interface 214. The host interface 211 includes protocols used to exchange data/commands between the host 100 and the controller 210. The controller 210 is configured to communicate with an external device (host) using at least one of various interface protocols, such as a USB protocol, an MMC protocol, a PCI protocol, a PCI-E protocol, an ATA protocol, a serial-ATA protocol, a parallel-ATA protocol, an SCSI protocol, an ESDI protocol, and an IDE protocol.

The memory interface 214 interfaces with the flash memory 220. The memory interface 214 includes, for example, a NAND interface or a NOR interface. The cache buffer 212 may be used as at least one of an operation memory of the processor 213, a cache memory between the flash memory 220 and the host 100, and a buffer memory between the flash memory 220 and the host 100. The cache buffer 212 may temporarily store data to be written to the flash memory 220 or data read from the flash memory 220. The cache buffer 212 may store a sequence number of each page which will be described later.

The processor 213 controls the overall operation of the controller 210.

In some embodiments, the controller 210 may additionally include an error correction block. The error correction block may be configured to detect and correct errors of data read from the flash memory 220 by using error correction code (ECC).

Operations of a system according to some embodiments of the present inventive concept will now be discussed with reference to FIGS. 4 through 7. FIGS. 4 through 7 are diagrams illustrating the operation of a system according some embodiments of the present inventive concept.

Figure 4:
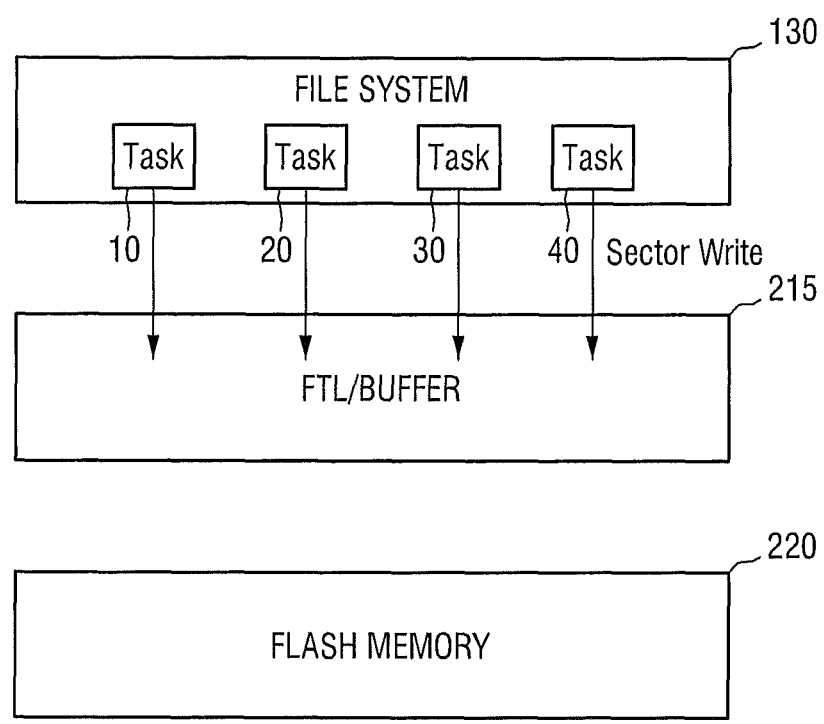
FIGS. 4 through 7 are diagrams illustrating the operation of a system according to some embodiments of the present inventive concept.

Referring now to FIG. 4, the host 100 has a software layer including a file system 130, and the file system 130 may be driven by the host processor 110. The controller 210 has a software layer including a flash translation layer (FTL)/buffer 215, and the FTL/buffer 215 may be driven by the controller 210.

The file system 130 receives a write request from an application and transmits data to be written and a sector address to the FTL/buffer 215. The file system 130 may transmit a plurality of tasks 10 through 40 to the FTL/buffer 215. In these embodiments, a task is a unit of work that accesses the flash memory 220 in response to a command from the host 100. A plurality of data to be written to the flash memory 220 may be grouped into one or more tasks.

The FTL/buffer 215 does not transmit the tasks 10 through 40 received from the file system 130 to the flash memory 220. Instead, the FTL/buffer 215 temporarily stores the tasks 10 through 40 in the cache buffer 212 until a sync signal, which will be discussed further below.

Figure 5:
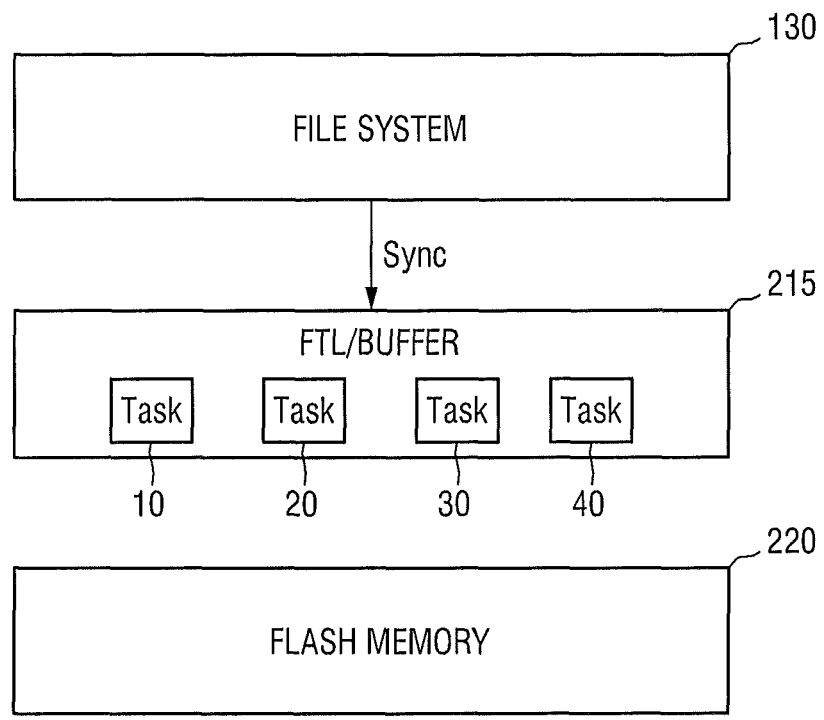

Referring now to FIG. 5, the file system 130 transmits a sync signal Sync to the FTL/buffer 215. The sync signal Sync may function to program the tasks 10 through 40, which are temporarily stored in the cache buffer 212, into the flash memory 220 at a time.

Figure 6:
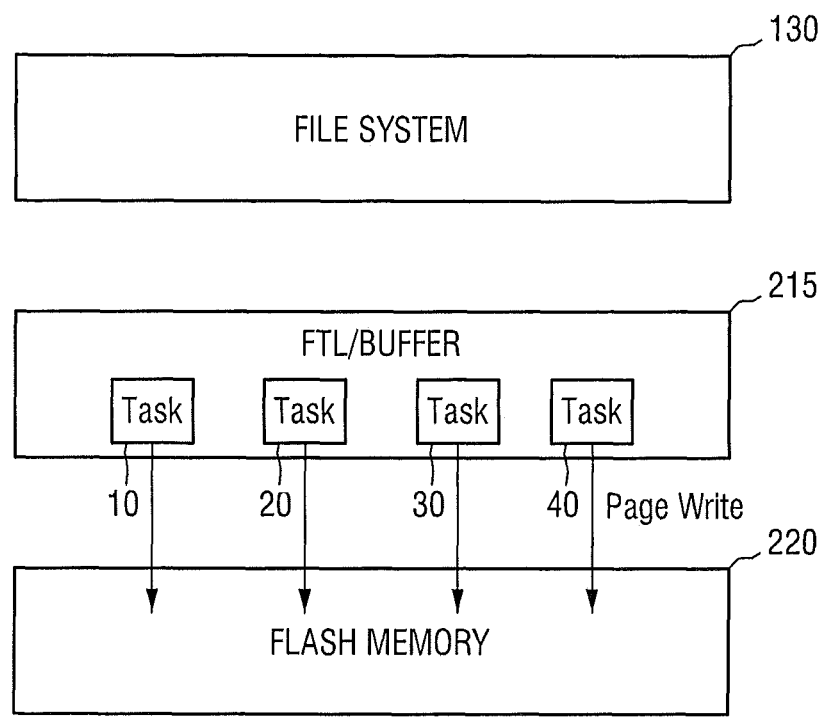

Referring now to FIG. 6, the FTL/buffer 215 transmits data to be written and a page address to the flash memory 220 according to the sync signal Sync received from the file system 130.

The FTL/buffer 215 translates a sector address which is a logical address received from the file system 130 into a page address which is a physical address of the flash memory 220 and transmits the page address. Mapping information between the sector address and the page address may be stored in the cache buffer 212 or the flash memory 220.

Figure 7:
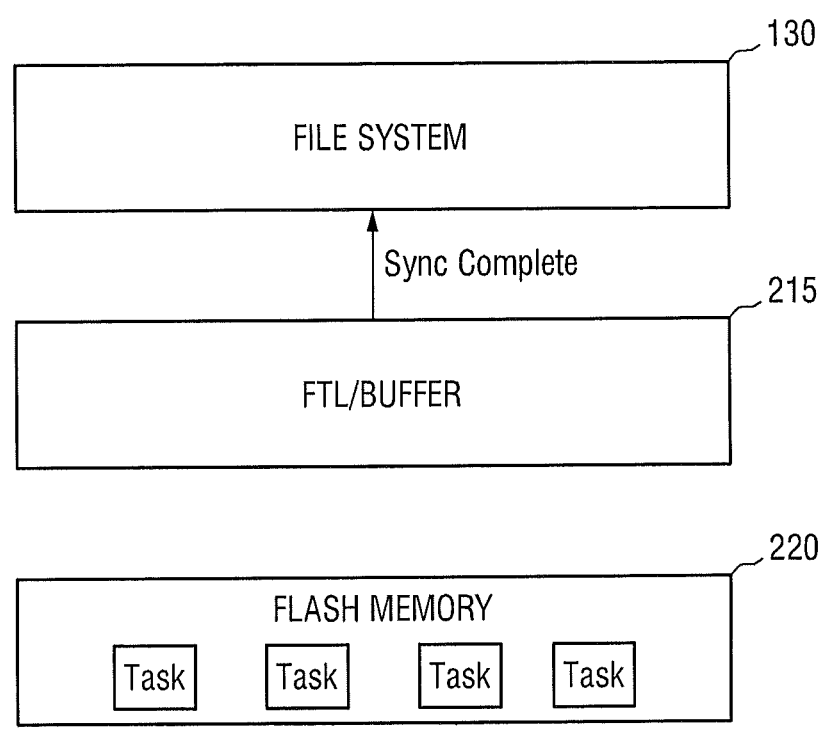

Referring now to FIG. 7, after the execution of the tasks 10 through 40 is completed, that is, after the data to be written are all programmed into the flash memory 220, the FTL/buffer 215 transmits a complete signal Sync Complete to the file system 130.

In the system 1 according to some embodiments, when data is written to the flash memory 220, an LSB page is programmed into a memory cell, and then an MSB page is programmed into the memory cell into which the LSB page has been programmed.

When the MSB page is programmed, the state of the LSB page paired with the MSB page changes. Thus, if sudden power off (SPO) occurs, the programmed LSB page can be damaged.

To address this problem, a conventional flash memory storage device backs up an LSB page paired with an MSB page before programming the MSB page and then programs the MSB page. However, if all LSB pages are backed up as discussed above, the performance of the flash memory storage device may be degraded.

In the system 1 according to the some embodiments, the controller 210 determines a transaction using the sync signal Sync received from the host 100. A transaction is a unit of work that can execute a plurality of tasks at a time. Since a plurality of tasks can be executed at a time according to the sync signal Sync as discussed above, the controller 210 determines a transaction using the sync signal Sync received from the host 100.

When programming an LSB page and an MSB page in the same transaction, the controller 210 does not back up the LSB page. On the other hand, when programming an LSB page and an MSB page in different transactions, the controller 210 backs up the LSB page.

To identify the scope of a transaction, the controller 210 may compare a sequence number of an LSB page with a reference sequence number.

A sequence number is metadata of a page programmed into a flash memory 220. As discussed below, sequence numbers are allocated to pages programmed into the flash memory 220 in the order of a first way way 0 of a first channel Ch 0, a first way way 0 of a second channel Ch1, a second way way 1 of the first channel Ch0, and a second way way 1 of the second channel Ch1. The sequence number of each page may be stored in the cache buffer 212 or the flash memory 220.

The reference sequence number may be a sequence number of a page programmed last in a previous transaction, that is, a last sequence number. A default value or initial value of the last sequence number may be stored as 0.

When programming an MSB page in a current transaction, if a sequence number of an LSB page is greater than the reference sequence number, the controller 210 may determine that the LSB page and the MSB page are programmed in the same transaction. Therefore, the controller 210 does not back up the LSB page in the current transaction. On the contrary, if the sequence number of the LSB page is not greater than the reference sequence number, the controller 210 may determine that the LSB page and the MSB page are programmed in different transactions. Therefore, the controller 210 backs up the LSB page in the current transaction.

The system 1 according to some embodiments may reduce, or possibly minimize, the number of LSB pages that are backed up and improve the performance of the storage device 200.

Referring back to FIG. 1, the controller 210 and the flash memory 220 may be integrated into one storage device 200. Specifically, the controller 210 and the flash memory 220 may be integrated into one semiconductor device to form a memory card. For example, the controller 210 and the flash memory 220 may be integrated into one semiconductor device to form a multimedia card (e.g., MMC, RS-MMC, MMCmicro), a secure digital (SD) card (e.g., SD, miniSD, microSD, SDHC), a universal flash storage (UFS), a personal computer (PC) card (e.g., Personal Computer Memory Card International Association (PCMCIA)), a compact flash (CF) card, a smart media card (SM, SMC), or a memory stick.

Alternatively, the controller 210 and the flash memory 220 may be integrated into one semiconductor device to form a solid state drive (SSD). The SSD includes a storage device which stores data in a semiconductor memory.

The system 1 may be provided as one of various components of an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, a radio frequency identification (RFID) device, or one of various components constituting a computing system.

The flash memory 220, the storage device 200, or the system 1 may be packaged using various types of packages. For example, the flash memory 220, the storage device 200, or the system 1 may be packaged using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

Figure 8:
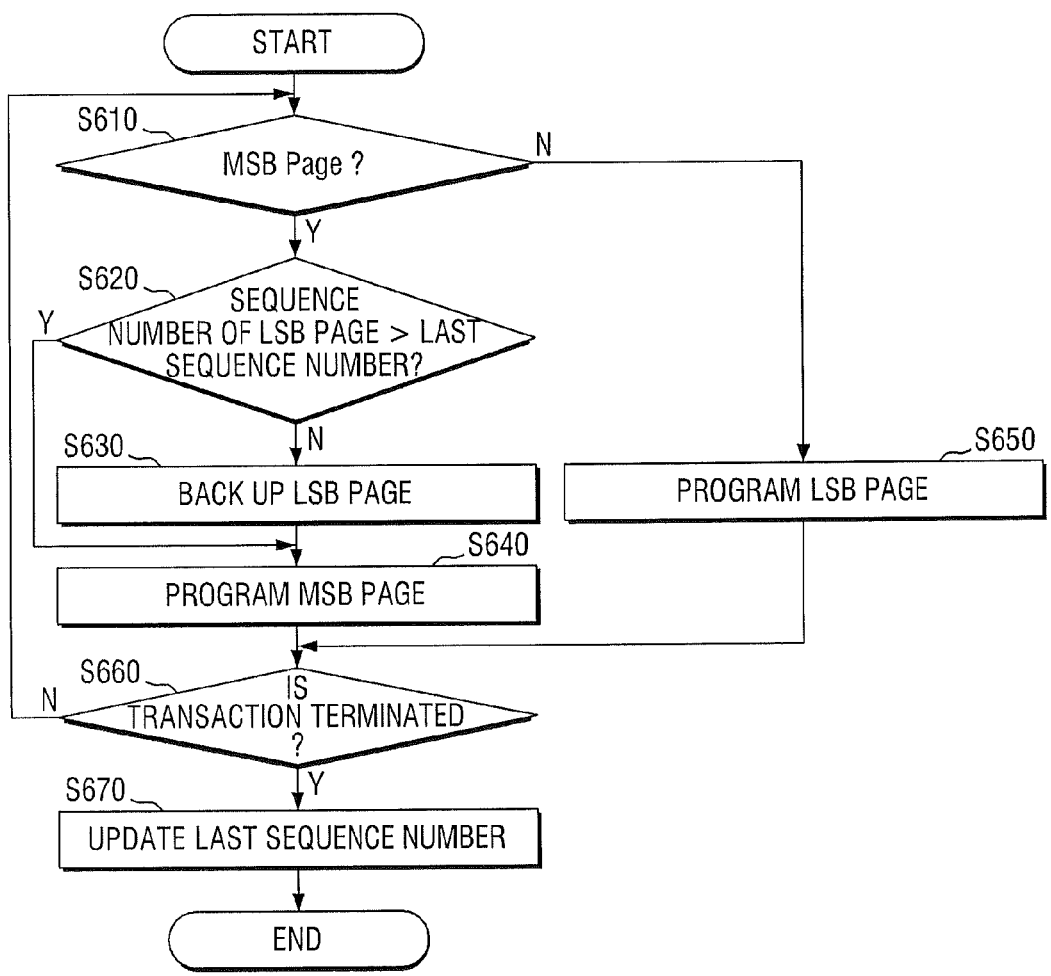
FIG. 8 is a flowchart illustrating methods of operating a system according to some embodiments of the present inventive concept.

Methods of operating the system 1 according to some embodiments of the present inventive concept will now be discussed with reference to FIG. 8. FIG. 8 is a flowchart illustrating methods of operating a system according to some embodiments of the present inventive concept.

Referring now to FIG. 8, the controller 210 determines whether data to be programmed into the flash memory 220 is an MSB page (operation S610).

If the data to be programmed into the flash memory 220 is the MSB page, the controller 210 determines whether a sequence number of an LSB page paired with the MSB page is greater than a last sequence number (operation S620).

If the sequence number of the LSB page is not greater than the last sequence number, the controller 210 backs up the LSB page (operation S630). If the sequence number of the LSB page is greater than the last sequence number, the controller 210 does not back up the LSB page.

The controller 210 programs the MSB page into the flash memory 220 (operation S640). Meanwhile, if the data to be programmed into the flash memory 220 is an LSB page, the controller 210 programs the LSB page into the flash memory 220 (operation S650). As described above, an LSB page paired with an MSB page is generally programmed before the MSB page.

The controller 210 determines whether a current transaction is terminated (operation S660).

If the current transaction is terminated, the controller 210 updates the last sequence number to a sequence number of a page programmed last in the current transaction and stores the updated last sequence number (operation S670). If the current transaction is not terminated, the controller 210 repeats the whole process from operation S610.

A flash memory programmed according to the method of FIG. 8 will be discussed below. FIGS. 9 through 12 are diagrams illustrating a flash memory programmed according to the method of FIG. 8.

Figure 9:
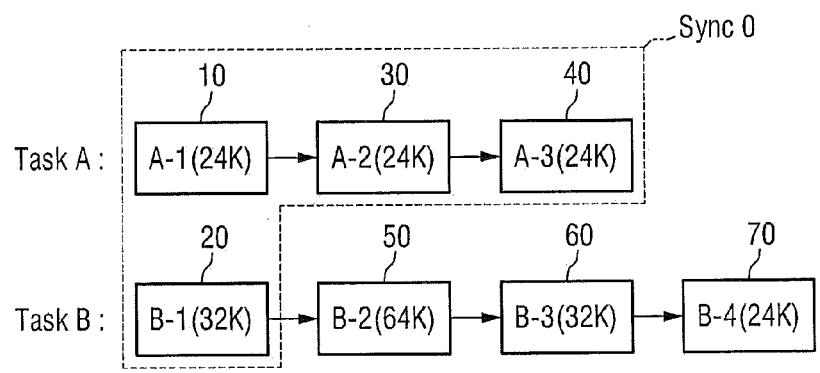
FIGS. 9 through 12 are diagrams illustrating a flash memory programmed according the method of FIG. 8.

Referring now to FIG. 9, in a multi-tasking environment, the host 100 may request the storage device 200 to execute a task Task A about a first application and a task Task B about a second application. The task Task A about the first application may include a first task 10, a third task 30 and a fourth task 40, and the task Task B about the second application may include a second task 20, a fifth task 50, a sixth task, and a seventh task 70.

In these embodiments, the host 100 transmits data of the first through fourth tasks 10 through 40 to the storage device 200. The first through fourth tasks 10 through 40 may form a first transaction according to a first sync signal Sync 0 and then be programmed into the flash memory 220.

Figure 10:
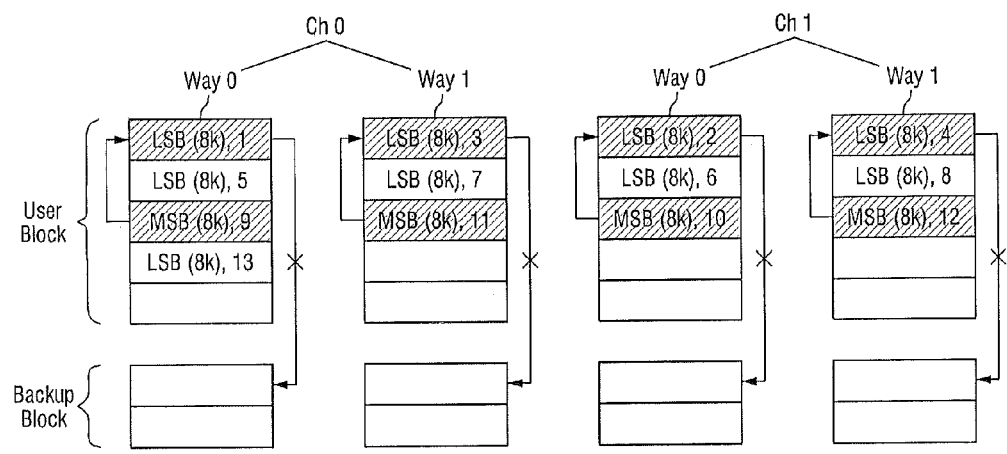
Figure 11:
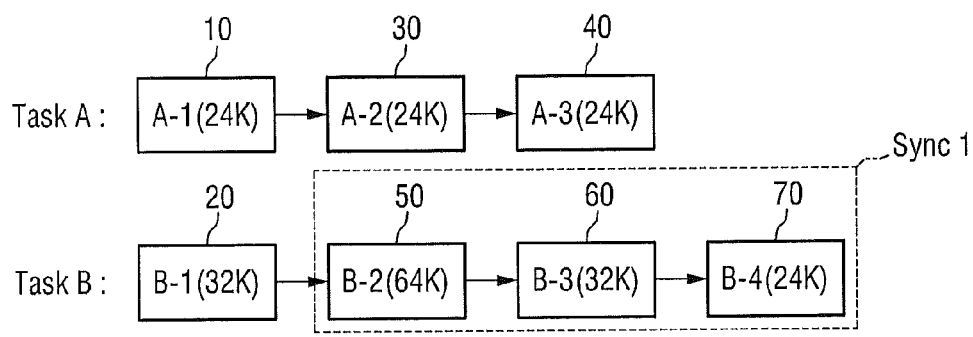

Referring now to FIG. 10, the flash memory 220 includes a first block into which LSB and MSB pages are programmed and a second block into which the LSB pages are backed up. For example, the first block may be a user block, and the second block may be a backup block. Each page of the flash memory 220 may be, for example, 8 Kbytes in size.

As the first through fourth tasks 10 through 40 are executed, LSB and MSB pages of the flash memory 220 are programmed. Sequence numbers are allocated to pages programmed into the flash memory 220 in the order of the first way way 0 of the first channel Ch0, the first way way 0 of the second channel Ch1, the second way way 1 of the first channel Ch0, and the second way way 1 of the second channel Ch1.

Since the host 100 transmitted the data of the first through fourth tasks 10 through 40, a last sequence number may have a default value or initial value of 0.

As illustrated in FIG. 10, the controller 210 programs MSB pages with sequence numbers of 9 through 12. However, since sequence numbers "1 through 4" of LSB pages paired with the MSB pages are greater than the last sequence number, the controller 210 does not back up the LSB pages into the backup block. This is because the LSB pages with the sequence numbers of 1 through 4 and the MSB pages with the sequence numbers of 9 through 12 are programmed in the same first transaction.

Referring now to Figure to 11, the host 100 transmits data of the fifth through seventh tasks 50 through 70 to the storage device 200. The fifth through seventh tasks 50 through 70 may form a second transaction according to a second sync signal Sync 1 and then be programmed into the flash memory 220.

Figure 12:
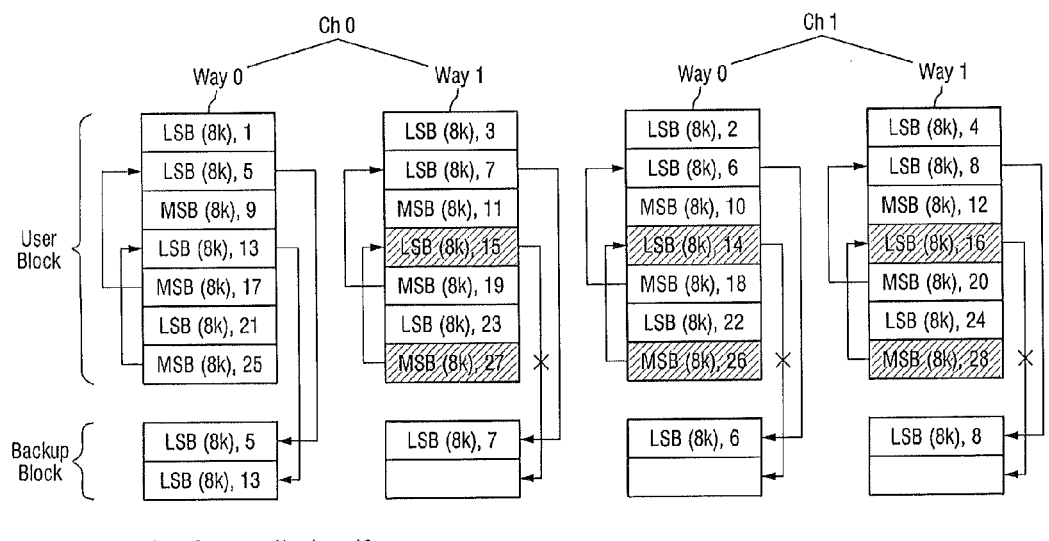

Referring now to FIG. 12, the last sequence number is updated to a sequence number "13" of an LSB page programmed last in the previous transaction, that is, the first transaction.

In FIG. 12, the controller 210 programs MSB pages with sequence numbers of 17, 18, 19, 20 and 25. However, since sequence numbers "5, 6, 7, 8 and 13" of LSB pages paired with the MSB pages are not greater than the last sequence number, the controller 210 backs up the LSB pages into the backup block in advance. This is because the LSB pages with the sequence numbers of 5, 6, 7, 8 and 13 and the MSB pages with the sequence numbers of 17, 18, 19, 20 and 25 are programmed in the first and second transactions, respectively.

Similarly to the case of FIG. 10, while the controller 210 programs MSB pages with sequence numbers of 26, 27 and 28 in the second transaction, it does not back up LSB pages paired with the MSB pages into the backup block.

Steps of a method or algorithm described in connection with the aspects disclosed herein may be embodied directly in hardware, in a software module executed by a processor, or in a combination of the two. A software module may reside in a RAM, a flash memory, a ROM, an electrically programmable ROM (EPROM), an electrically erasable programmable ROM (EEPROM), a register, a hard disk, a removable disk, a CD-ROM, or any other form of computer-readable recording medium known in the art. An exemplary recording medium may be coupled to a processor such that the processor can read information from and write information to the recording medium. An exemplary recording medium may be integral to the processor. The processor and the storage medium may reside in an application specific integrated circuit (ASIC). The ASIC may reside in user equipment. In the alternative, the processor and the storage medium may reside, as discrete components, in user equipment.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A storage device comprising:
a flash memory, including a first channel and a second channel, each of the first channel and the second channel including a first way and a second way; and
a controller programming a plurality of tasks into the flash memory, each of the plurality of tasks including first bit data and second bit data,
wherein the controller does not back up the first bit data when programming the first bit data and the second bit data in a same transaction and backs up the first bit data when programming the first bit data and the second bit data in different transactions, wherein each of the transactions includes the plurality of tasks;
wherein the first bit data is less significant bit data and the second bit data is most significant bit data;
wherein each of the transactions is determined using a sync signal transmitted from a host;
wherein a sequence number is allocated to one of the first bit data and the second bit data programmed into the flash memory in the order of the first way of the first channel, the first way of the second channel, the second way of the first channel, and the second way of the second channel; and
wherein if a sequence number of the first bit data is greater than a reference sequence number, the controller is configured to determine that the first bit data and the second bit data are programmed in a same transaction.

2. The storage device of claim 1, wherein the reference sequence number is a sequence number of bit data programmed last in a previous transaction.

3. The storage device of claim 2, wherein when a transaction is terminated, the controller is configured to update the reference sequence number and store the updated reference sequence number.

4. The storage device of claim 1, wherein the controller is configured to program a plurality of bit data into the flash memory according to the sync signal.

5. The storage device of claim 4, wherein each of the plurality of tasks comprise programming the plurality of bit data into the flash memory using the controller.

6. The storage device of claim 1, wherein the controller is configured to back up the first bit data into a backup block of the flash memory.

7. The storage device of claim 6, wherein the controller is configured to program the first bit data and the second bit data into a user block of the flash memory.

8. A storage device comprising:
a flash memory including a first channel and a second channel, each of the first channel and the second channel including a first way and a second way; and
a controller configured to program a plurality of tasks into the flash memory, each of the plurality of tasks including first bit data and second bit data,
wherein a sequence number is allocated to one of the first bit data and the second bit data programmed into the flash memory in the order of the first way of the first channel, the first way of the second channel, the second way of the first channel, and the second way of the second channel;
wherein when programming the second bit data in a current transaction the controller does not back up the first bit data in the current transaction if the sequence number of the first bit data is greater than a reference sequence number and backs up the first bit data in the current transaction if the sequence number of the first bit data is not greater than the reference sequence number, wherein each of the transactions includes the plurality of tasks;
wherein the first bit data is less significant bit data and the second bit data is most significant bit data; and
wherein the reference sequence number is a sequence number of bit data programmed last in a previous transaction.

9. The storage device of claim 8, wherein each of the transactions is determined using a sync signal transmitted from a host.

10. The storage device of claim 9, wherein when a transaction is terminated, the controller is configured to update the reference sequence number and store the updated reference sequence number.

11. The storage device of claim 8, wherein if the sequence number of the first data is greater than the reference sequence number, the controller is configured to program the first bit data and the second bit data in a same transaction.

12. The storage device of claim 8, wherein the controller is configured to back up the first bit data into a backup block of the flash memory.

13. The storage device of claim 12, wherein the controller is configured to program the first bit data and the second bit data into a user block of the flash memory.

14. A flash memory comprising:
a first channel including a first way and a second way; and
a second channel including a third way and a fourth way,
wherein each of the first way, the second way, the third way and the fourth way include a first block, first bit data and second bit data being programmed in the first block; and a second block, wherein the first bit data is not backed up in the second block when the first bit data and the second bit data are programmed in a same transaction and the first bit data is backed up in the second block when the first bit data and the second bit data are programmed in different transactions, wherein each of the transactions includes a plurality of tasks;
wherein the first bit data is less significant bit data than the second bit data; and
wherein each of the transactions is determined using a sync signal transmitted from a host;
wherein a sequence number is allocated to one of the first bit data and the second bit data programmed into the flash memory in the order of the first way of the first channel, the third way of the second channel, the second way of the first channel, and the fourth way of the second channel; and wherein if a sequence number of the first bit data is greater than a reference sequence number, the controller is configured to determine that the first bit data and the second bit data are programmed in a same transaction.

15. The flash memory of claim 14, further comprising a controller that does not back up the first bit data into the second block if a sequence number of the first bit data is greater than a reference sequence number.

16. The flash memory of claim 15:
wherein the reference sequence number is a sequence number of bit data programmed last in a previous transaction.

17. The flash memory of claim 16, wherein when a transaction is terminated, the controller is configured to update the reference sequence number and store the updated reference sequence number.

18. The flash memory of claim 14, wherein a plurality of bit data are programmed into the first block according to the sync signal.

19. The flash memory of claim 18, wherein each of the plurality of transactions comprises programming the plurality of bit data into the first block using the controller.

20. A method of operating a storage device, the method comprising:
programming first bit data into a flash memory including a first channel and a second channel, each of the first channel and the second channel including a first way and a second way,
wherein a sequence number is allocated to the first bit data programmed into the flash memory in the order of the first way of the first channel, the first way of the second channel, the second way of the first channel, and the second way of the second channel;
determining whether the sequence number of the first bit data is greater than a reference sequence number before programming second bit data into the flash memory; and
not backing up the first bit data if the sequence number of the first bit data is greater than the reference sequence number,
wherein each of the transactions includes a plurality of tasks; and
wherein the first bit data is less significant bit data and the second bit data is most significant bit data, and the reference sequence number is a sequence number of bit data programmed last in a previous transaction.

21. The method of claim 20, further comprising backing up the first bit data if the sequence number of the first bit data is not greater than the reference sequence number.

22. The method of claim 21, wherein in the programming of the first bit data into the flash memory, the first bit data is programmed into a user block of the flash memory, and in the backing up of the first bit data, the first bit data is backed up into a backup block of the flash memory.

23. The method of claim 20, wherein each of the transactions is determined using a sync signal transmitted from a host.

24. The method of claim 23, further comprising:
determining whether a current transaction is terminated; and
updating the reference sequence number to a sequence number of bit data programmed last in the current transaction and storing the updated reference sequence number when the current transaction is terminated.

* * * * *